United States Patent [19]

Isono et al.

[11] Patent Number: 5,329,485
[45] Date of Patent: Jul. 12, 1994

[54] MEMORY DEVICE

[75] Inventors: Yasuo Isono; Masamichi Morimoto; Hiroshi Nakano, all of Tokyo, Japan

[73] Assignee: Olympus Optical Co., Ltd., Tokyo, Japan

[21] Appl. No.: 784,380

[22] Filed: Oct. 29, 1991

[30] Foreign Application Priority Data

Nov. 1, 1990 [JP] Japan ................... 2-296922
Nov. 15, 1990 [JP] Japan ................... 2-309369

[51] Int. Cl.⁵ .................... G11C 11/22; G11C 7/00
[52] U.S. Cl. ..................... 365/145; 365/189.01
[58] Field of Search ............. 365/145, 117, 189.01, 365/218; 257/295

[56] References Cited

U.S. PATENT DOCUMENTS

| | | | |
|---|---|---|---|
| 4,860,254 | 8/1989 | Pott et al. | 365/145 |
| 4,972,370 | 11/1990 | Morimoto et al. | 365/106 |
| 5,046,043 | 9/1991 | Miller et al. | 365/145 |
| 5,072,262 | 12/1991 | Uekita et al. | 257/410 |
| 5,075,738 | 12/1991 | Matsuda et al. | 257/49 |
| 5,077,762 | 12/1991 | Morimoto et al. | 365/183 X |
| 5,220,202 | 6/1993 | Isono et al. | 365/45 |

OTHER PUBLICATIONS

IEEE Transactions on Electrical Insulation, vol. 25, No. 3, Jun. 1990, pp. 541-548, M. Iwamoto.
IEEE Transaction on Electric Insulation vol. 25, No. 3, Jun. 1990, pp. 435-441.
FAM: 16.3: A 16kb Ferroelectric Memory with a Bit Parallel Architecture, IEEE ISCC 1989, pp. 242-243.

Primary Examiner—Eugene R. LaRoche
Assistant Examiner—Son Dinh
Attorney, Agent, or Firm—Frishauf, Holtz, Goodman, Woodward

[57] ABSTRACT

According to this invention, there is provided a memory element and a matrix memory cell array including memory cells each having a nonlinear conductivity bipolar switching element constituted by a multi-layered structure which performs writing/reading operations of a polarization state of a ferroelectric body, i.e., a recording medium of the memory cell, as data and which is constituted by an insulating layer of a predetermined-thickness Langmuir-Blodgett film using most of a switching drive current as a direct tunnel current and conductive layers formed on both the surfaces of the insulating layer.

6 Claims, 9 Drawing Sheets

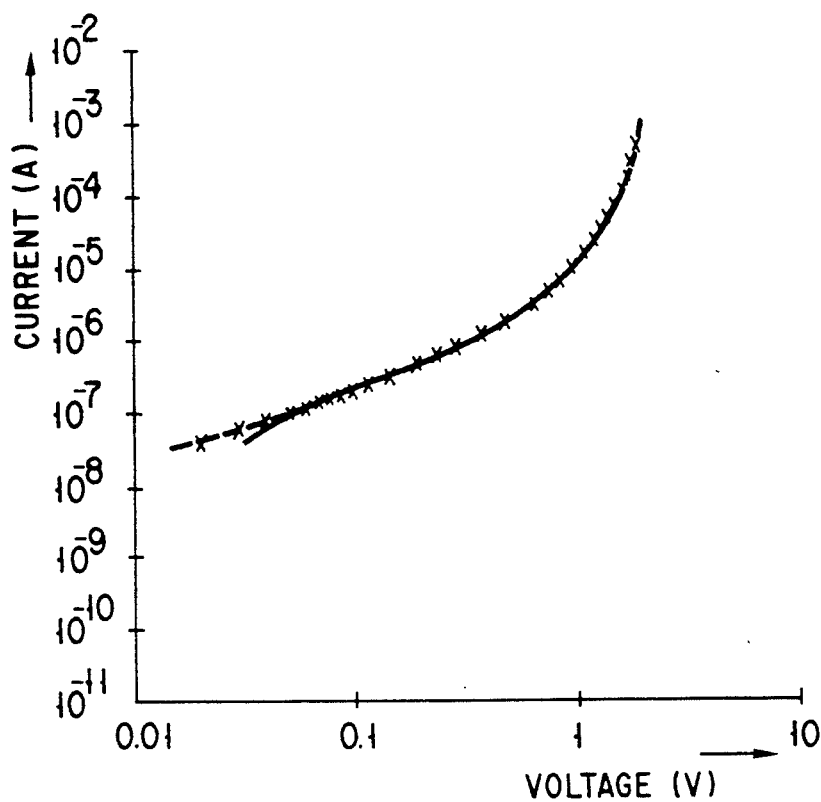
F I G. 3
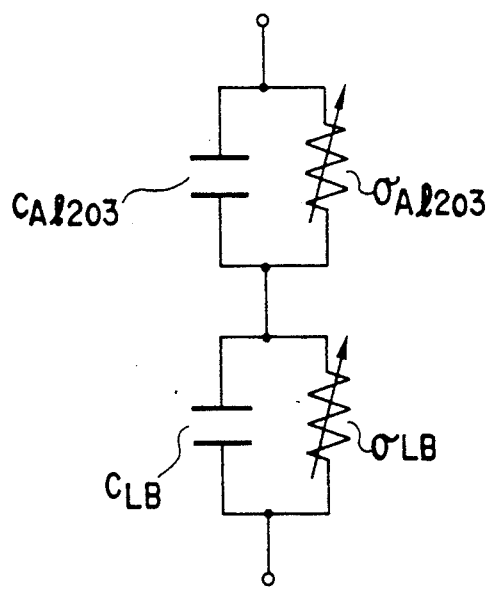
F I G. 4

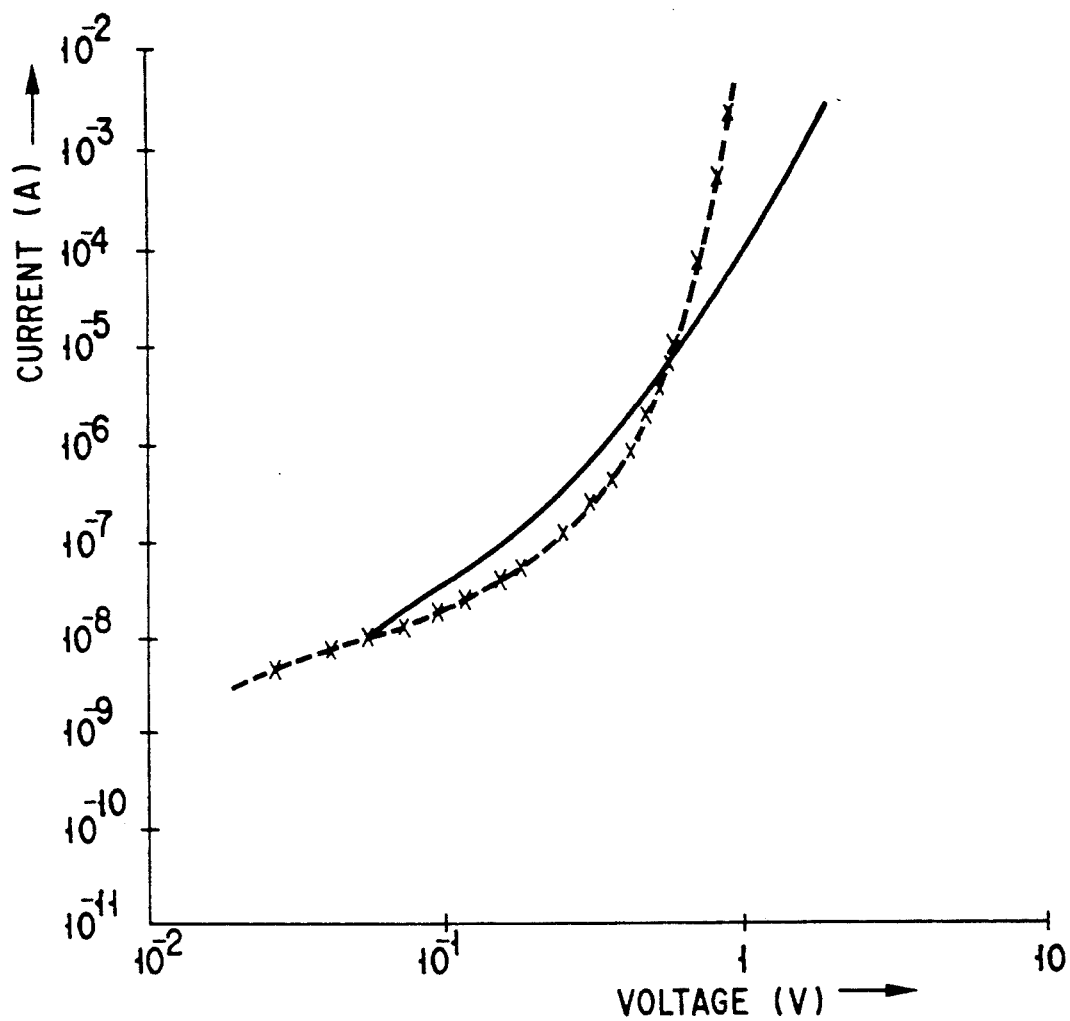
F I G. 5

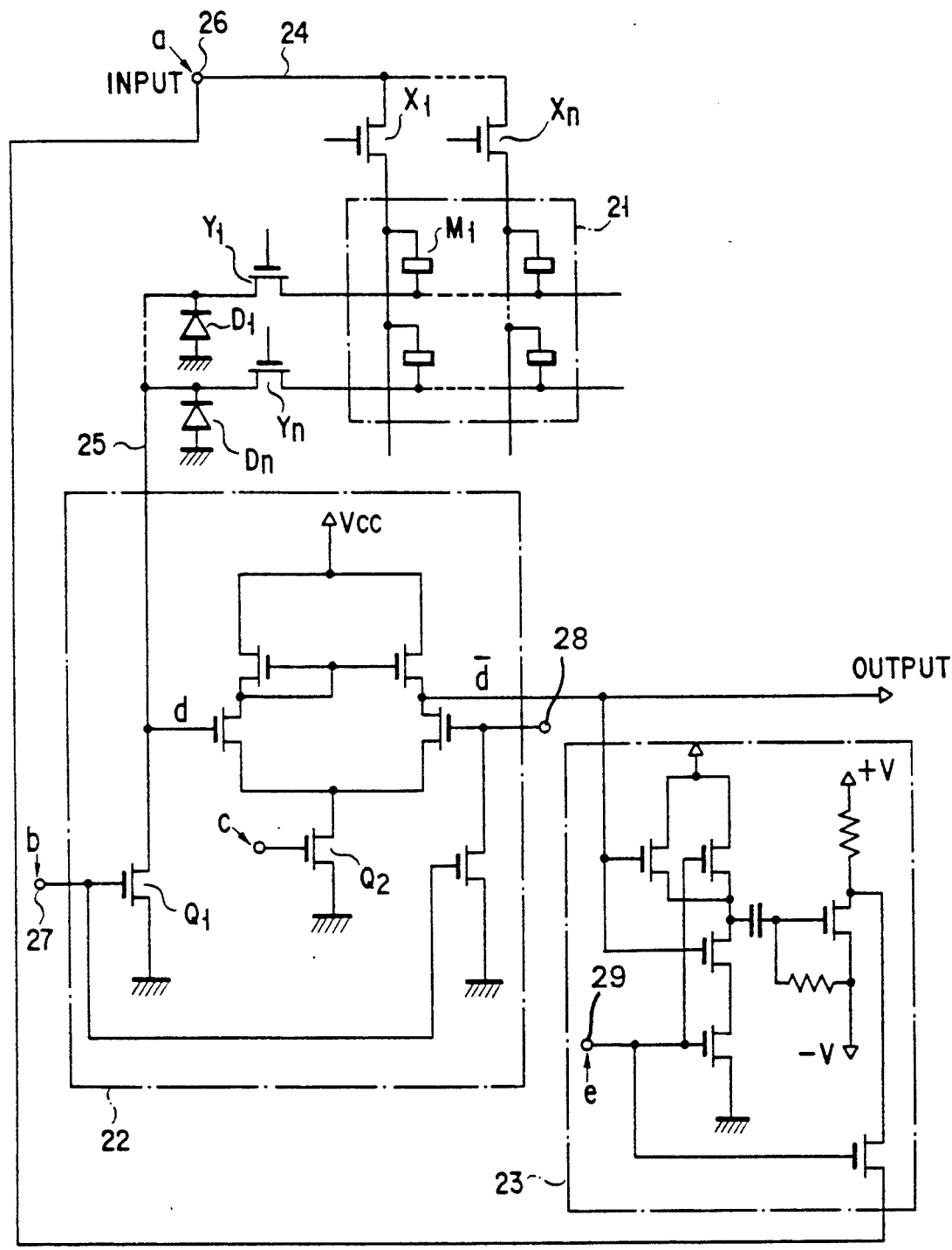
F I G. 13

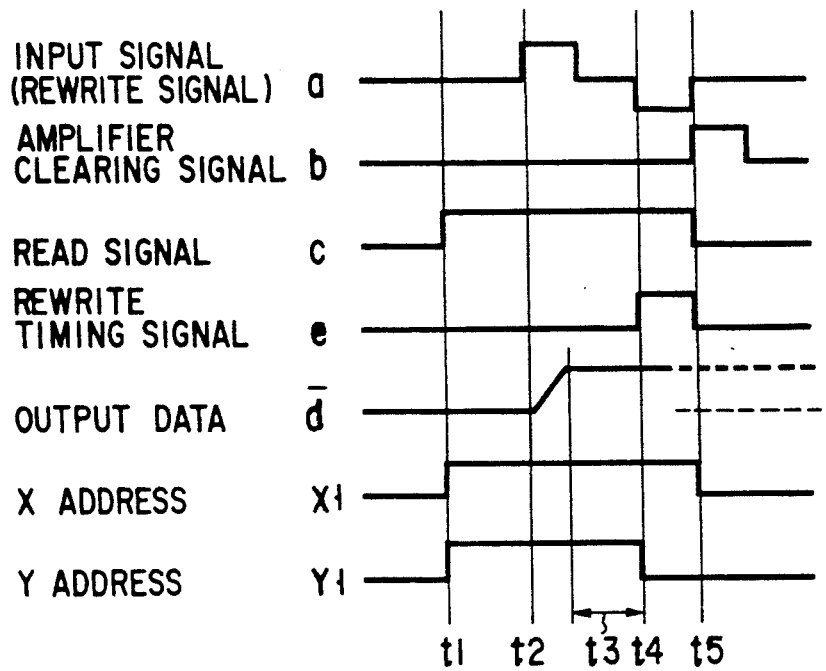
F I G. 14A
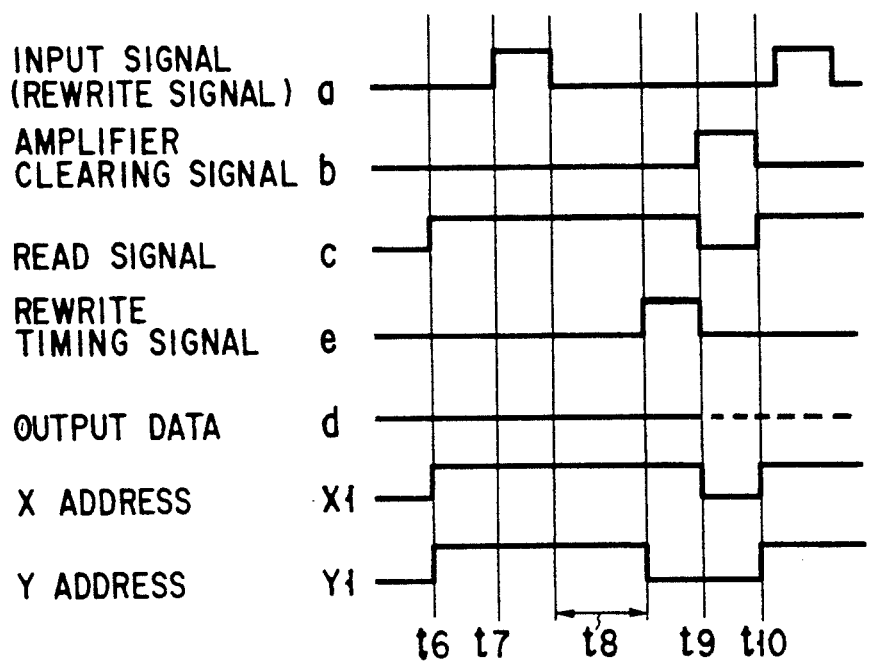
F I G. 14B

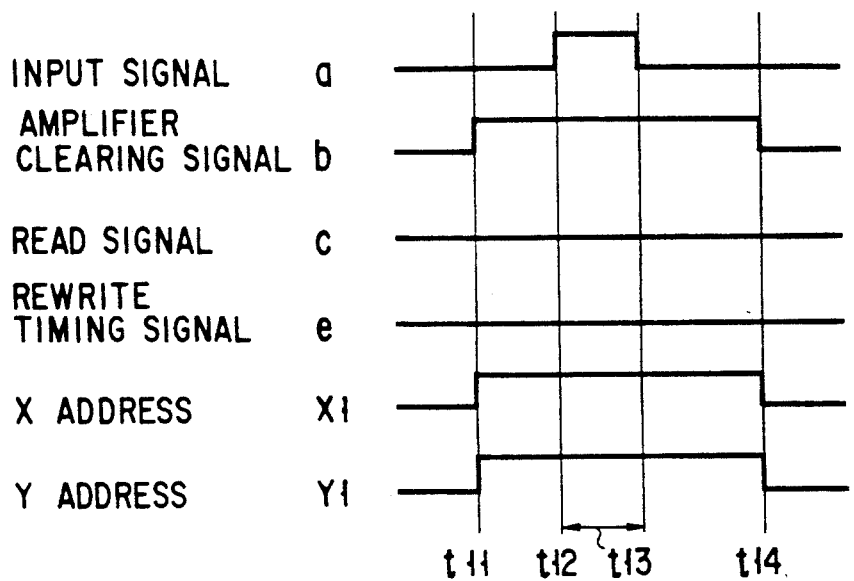
F I G. 15A
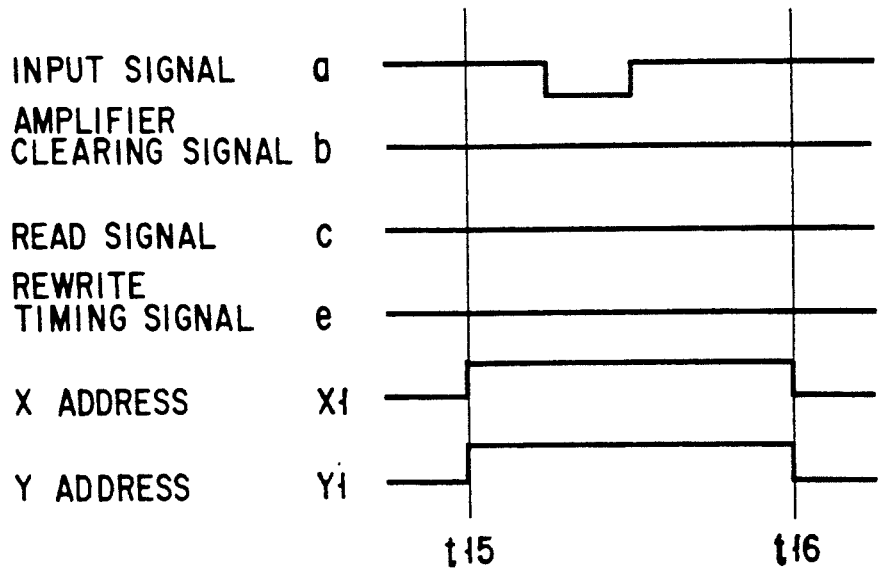
F I G. 15B

MEMORY DEVICE

BACKGROUND OF THE INVENTION

1. Field of the Invention

The present invention relates to a semiconductor memory device and, more particularly, to a memory device having an MIM nonlinear conductivity element.

2. Description of the Related Art

There is generally provided an MIM (metal-insulating film-metal) memory device in which a ferroelectric body having a theoretically infinite retention time of stored data is used as a recording/retaining section (storage medium) and a switch for controlling write-/read access of the stored data is arranged. As the switch, a switch or an MIM switch is used. The MIM switch is a two-terminal switch for switching an ON-/OFF state by using nonlinear current-voltage characteristics. In the nonlinear current-voltage characteristics, a current having a rapidly increased value flows when a voltage having a predetermined voltage value is applied.

In relation to the two-terminal switch, a ferroelectric memory using a MOS switch as a data input/output switch is described in "R. Womack et al Proc. of IEEE ISCC 1989 PP. 242-243".

As an insulating film used in the MIM switch, a Langmuir-Blodgett (LB) film obtained by stacking orientated monomolecular layers has been proposed.

For example, when 30 layers (120 Å) made of a polyimide insulator are used as the LB film, the current-voltage characteristic curve of an MIM element, as shown in FIG. 16, is obtained. This current is constituted by a direct tunnel current or the like, a high-voltage region of the current-voltage characteristic curve corresponds to the Fowler-Nordheim current (to be referred to as an F-N current hereinafter) formula.

As shown in FIG. 6, in an energy diagram of electrons of the MIM element, assume that the thickness of the insulating layer is set to be "d" and that the height of an energy barrier is set to be "$\phi$". At this time, when a potential difference V ($\phi$<eV) is applied across metal electrodes arranged on both the sides of the insulating layer, it is expected that a current value I of a current flowing into (passing through) the insulating layer depends on the following F-N current formula (1):

$$\frac{1}{V^2} = C\exp\left[-\left(\frac{8D\pi (2m)^{\frac{1}{2}}}{3he} \times d \times \phi^{\frac{3}{2}}\right)\frac{1}{V}\right] \quad (1)$$

for $$C = \frac{e^3}{4\pi h\phi d^2}$$

Therefore, in an F-N conductive region, a relationship of $\log(I/V^2) \propto 1/V$ is held, and the slope of the curve indicating the relationship is a function of $$(d \cdot \phi^{\frac{3}{2}}).$$

When the LB film is used, since the value d is estimated by the number of stacked monomolecular films, the value "m" can be calculated by the slope of an F-N plots.

That is, as shown in FIG. 17, it is found that the F-N plots have a linear portion in a high-voltage region. In this linear portion, the F-N current formula (1) is held, and the energy barrier height $\phi$=0.65 eV is calculated by the slope of the linear portion.

A conventional MIM memory uses an insulating film (a direct tunnel layer or an FN tunnel layer) as a switching element to accumulate charges in a charge accumulating ferroelectric capacitor C. The insulating film allows a direct tunnel current to flow when a voltage having a predetermined value or more is applied to the insulating film. Thereafter, the insulating film having a recovered insulating property retains the charges by preventing leakage of the charges.

Therefore, a data retention time is determined by an insulating resistivity of the insulating film. when data must be retained for a long time, the insulating resistivity must be increased by increasing the thickness of the insulating film or using a resistor having a high resistivity.

However, a time required for increasing the thickness of the insulating film is increased since an insulating resistance layer is formed by the LangmuirBlodgett (LB) method. In relation to memory characteristics, a write voltage applied for allowing a tunnel current to flow is increased.

In addition, since write access is performed by not a direct tunneling phenomenon but an FN tunneling phenomenon, a write speed is decreased by a decrease in charge injection efficiency.

Therefore, characteristics such as a long data retention time, a low driving voltage, and a short processing time cannot be easily obtained in a conventional memory structure.

In the F-N current, all electrons for applying a voltage V in a region of $\phi$<eV do not flow through (tunnel-conducting) the insulating film in the direction of thickness, and after they flow through a part in this direction, they flow at a conductive level of the insulating layer. The insulating film is damaged by heat generated when the electrons flow through the insulating layer. A decrease in breakdown voltage, and the like occur.

Therefore, in order to obtain satisfactory nonlinear characteristics, the value "eV" must be much larger than the value "$\phi$". That is, an operation voltage must be increased.

However, when memory elements are to be integrated, the high operation voltage is a disadvantageous factor to obtain an increase in integration density of the elements, an increase in an operation speed, stability of repetitive operations, and a decrease in power consumption.

SUMMARY OF THE INVENTION

It is, therefore, an object of the present invention to provide a memory element capable of improving film durability, operation stability, and power consumption, while a memory element having an MIM nonlinear conductivity switching element has nonlinear switching characteristics.

According to the present invention, there is provided a memory element and a matrix memory cell array using a ferroelectric body as a recording medium, comprising memory cells each having a nonlinear conductivity bipolar switching element which is constituted by a multilayered structure consisting of an insulating layer of a Langmuir-Blodgett film and conductive layers oppositely arranged on both major surfaces of the insulating layer, which performs write/read access using a polarization state of the ferroelectric body, and which is formed to have a predetermined thickness such that a large part of a drive current of the insulating film of the switching element is a direct tunnel current.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a graph showing current-voltage (I-V) characteristics of the MIM switching element;

FIG. 4 is a circuit diagram showing an electric equivalent circuit of a MIS switching element obtained by using aluminium as the electrode of the MIM switching element in FIG. 1;

FIG. 5 is a graph showing current-voltage characteristics of an MIM switching element obtained by forming a polyimide LB film as 11 molecular layers;

FIG. 13 is a schematic view showing a memory circuit using the memory cell array in FIG. 7;

FIGS. 14A and 14B are timing charts showing potentials of timings when data are read out to the memory circuit;

FIGS. 15A and 15B are timing charts showing potentials of timings when data are written in the memory circuit;

DETAILED DESCRIPTION OF THE PREFERRED EMBODIMENTS

Embodiments of the present invention will be described below with reference to the accompanying drawings.

Figure 1:
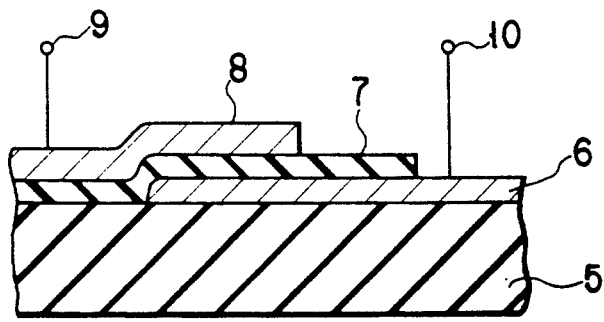
FIG. 1 is a view showing an arrangement of a nonlinear conductivity MIM switching element arranged in a memory element according to the first embodiment of the present invention.

FIG. 1 shows an arrangement of a nonlinear conductivity element (to be referred to as an MIM switching element hereinafter) arranged in a memory element according to the first embodiment of the present invention.

This MIM switching element is formed as follows. A first aluminium electrode 6 is formed on an insulating glass substrate 5 by deposition, a polyimide LB film 7 is formed on the first aluminium electrode 6 by an LB film forming technique (to be described later), and a second aluminium electrode 8 is formed thereon by deposition. Terminals 9 and 10 are formed on the aluminium electrodes, respectively.

The polyimide LB film 7 is formed by the method described in "Transactions of the Institute of Electronics vol. A 106 No. 9, P. 435 (September,1986) by Suzuki, et al." to form an insulating film having an appropriate thickness.

The step of forming the polyimide film 7 will be described below. A polyamide acid derivative (salt of polyamide acid and N.N-dimethyl-n-hexadecylamine) solution obtained by mixing a polyamide acid solution (using a liquid mixture of N.N-dimethylacetamide: benzene = 1:1 as a solvent at a concentration of 1 mm l/l) with an N.N-dimethyl-n-hexadecylamine solution (dissolved in the same solvent as that of the polyamide acid solution at the same concentration as that of the polyamide acid solution) at a molar ratio of 1:2 is prepared as an L film developing solution.

When the polyamide acid derivative solution is developed on a water surface, N.N-dimethyl-n-hexadecylamine acts as a hydrophobic group, thereby forming a monomolecular L film. A substrate is repeatedly dipped/removed in/from the water in the direction perpendicular to the water surface on which the monomolecular L film is formed, thereby forming a polyamide acid derivative LB film on the substrate. When the polyamide acid derivative LB film formed by the above method is kept dipped in a liquid mixture of acetic anhydride, pyridine, and benzene (volume ratio of 1:1:3), the added N.N-dimethyl-nhexadecylamine is eliminated, and polyamide acid is converted into an imide and is changed into a polyimide LB film. The polyimide LB film 7 is obtained by stacking 7 layers (28 Å).

Figure 2:
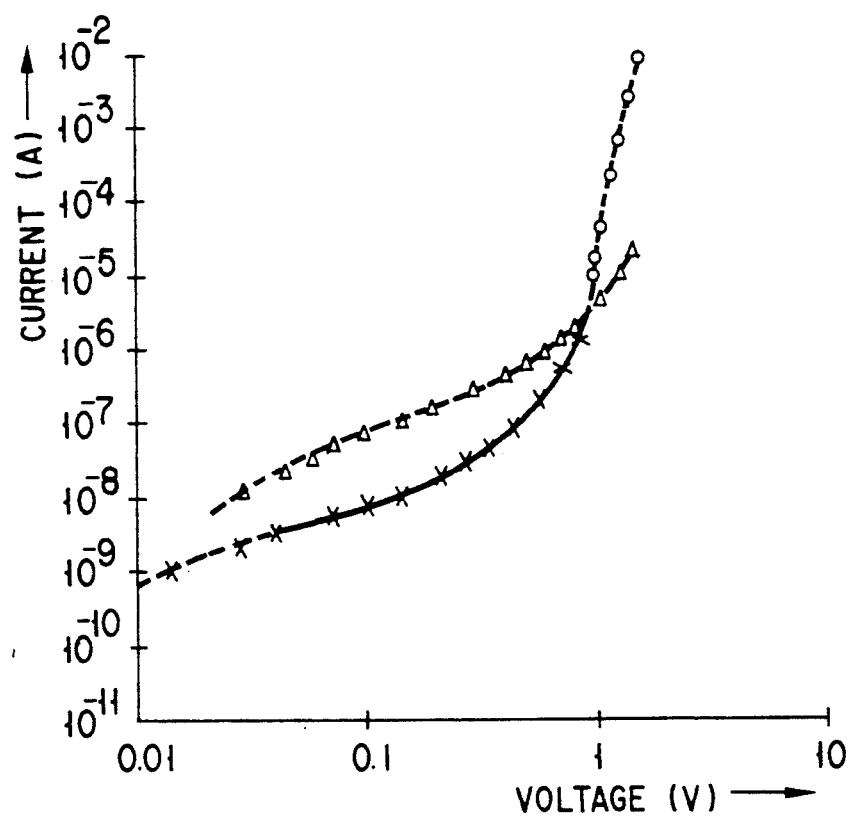
FIG. 2 is a graph showing applied voltage dependency as a function of a current flowing in the MIM switching element in FIG. 1.

FIG. 2 shows applied voltage dependency (current-voltage characteristics) with respect to a current flowing through the MIM switching element.

In FIG. 2, actual measurement data is indicated by a solid line obtained by plotting marks ×on the basis of calculation values calculated from the following tunnel current theoretical equation according to the WKB approximation method:

$$I = A\left[\left(\phi - \frac{eV}{2}\right)\exp\left\{-B\left(\phi - \frac{EV}{2}\right)\right\} - \left(\phi + \frac{eV}{2}\right)\exp\left\{-B\left(\phi + \frac{eV}{2}\right)\right\}\right] \quad (2)$$

where I: tunnel current, V: applied voltage, $$A = \frac{e}{2\pi h d^2}$$

$$B = \frac{4\pi d (2m)^{\frac{1}{2}}}{h}$$

m: an electron mass, e: electron charge,
h: the Planck's constant, $\phi = 0.65$ ev At this time, a value of $\phi = 0.65$ eV estimated by analyzing an F-N current flowing through an switching element having the polyimide LB film 7 constituted by 30 layers is substituted for a height m of a barrier between a metal layer and an insulating layer.

The absolute value of the calculation value is a function of an electron density n (Vx) in an electrode. In a practical sample, e.g., on the interface between the aluminium electrode and the polyimide LB film, an aluminium oxide film, an impurity absorbed during formation of the polyimide film, a surface local level, and the like may be present.

That is, although the aluminium electrode is formed on the LB film, since the LB film is formed while being kept dipped in a water solution in the atmosphere, an aluminium oxide film $Al_2O_3$ (to be referred to as an aluminium spontaneous oxide film hereinafter) is inevitably formed between the aluminium electrode and the polyimide LB film by oxygen and water in the atmosphere.

Due to the presence of the aluminium spontaneous oxide film, the absolute value obtained by actual calculation must be smaller than the calculation value obtained from a theoretical equation obtained by assuming that normal Fermi-Dirac distribution is set. In the following description, a current absolute value will be intentionally matched to the actual measurement value, and the current-voltage dependency will be considered. Equation (2) is formed while considering an influence of the aluminium spontaneous oxide film formed at the interface between the aluminium electrode and the polyimide LB film.

In addition to the first aluminium electrode 6 and the polyimide LB film 7, an imide-converted film is stacked on the glass substrate 5. A second aluminium electrode 8 is deposited on the imide-converted film to form an MIM switching element.

Current-voltage (I-V) characteristics of this switching element are shown in FIG. 3. This I-V characteristics are recognized as a tunnel current of the MIM switching element using the aluminium spontaneous oxide film as an insulating layer.

Assuming that the capacitance of the aluminium spontaneous oxide film is $1.7 \times 10^{-7}$ F and that a relative dielectric constant $\epsilon = 8.0$, the thickness d of the film is 29 Å. These values are substituted in equation (2), and a result obtained by matching the I-V characteristics is indicated by plotting marks x in FIG. 3 using the height $\phi$ of the barrier as a parameter. The height $\phi$ of the barrier obtained when the I-V characteristics best match actual measurement data (solid line) is 4.3 eV. Thus, the aluminium spontaneous oxide film acts as a tunnel barrier.

FIG. 4 shows an electrical equivalent circuit of an MIM switching element using aluminium as an electrode. An operation of the MIM switching element will be described below.

That is, each of an aluminium spontaneous oxide film and a polyimide LB film is regarded as a capacitance component C and a nonlinear conductivity component e which are parallelly connected to each other, and two circuits each of which is formed by parallelly connecting the capacitance component C and the nonlinear conductivity component e are connected in series.

In the normal state of the MIM switching element, it is assumed that a capacitor $C_{Al_2O_3}$ and a capacitor $C_{LB}$ are perfectly charged, electron tunnel probabilities D (Ex) of the films are determined by voltages $V_{Al_2O_3}$ and $V_{LB}$ distributed on the basis of the capacitances of these capacitors. Therefore, a current flowing through the MIM switching element is limited using a current value as a reference. The current value is defined by a smaller one of conductivities a derived from the electron tunnel probabilities D (Ex) of the films.

Assuming that the capacitance of the aluminium spontaneous oxide film is set to be $1.7 \times 10^{-7}$ F and that the dielectric constant $\epsilon = 3.2$, the capacitance of the polyimide LB film (thickness d = 28 Å) is calculated to be a value of $7.1 \times 10^{-8}$ F.

Assuming that an applied voltage V is distributed at the ratio of these capacitances, a voltage $V_{LB}$ applied to the polyimide LB film is calculated by equation (3):

$$V_{LB} = \frac{C_{Al_2O_3}}{C_{Al_2O_3} + C_{LB}} \times V = 0.71 \times V \quad (3)$$

Therefore, the calculation values shown by plotting marks × in FIG. 2 are equal to values obtained such that, assuming that a voltage 0.71 times the applied voltage V is applied to the LB film, the value is substituted for the component V in equation (2). That is, when a voltage of 0.92 V or more is applied to the MIM switching element, since a current falls within the F-N region, a calculation value is obtained on the basis of equation (1), and it is plotted by mark ○.

When the polyimide LB film has the thickness of 30 layers, the capacitance of the polyimide LB film is much smaller than that of the aluminium spontaneous oxide film. Therefore, it is estimated that all the voltage applied to the switching element is applied to the polyimide LB film.

In FIG. 2, when an actual measurement value is compared with a calculation value, the characteristics of these values are equal to each other when a voltage applied to the element is 0.9 V or less. However, when the voltage is 0.9 V or more, the actual measurement value is smaller than the calculation value, because a current to flow into the switching element may be restricted by the tunnel current of the aluminium spontaneous oxide film.

Since the actual measurement value (solid line) of the aluminium spontaneous oxide film shown in FIG. 3 is larger than the actual measurement value of the MIM switching element shown in FIG. 2, it seems as if the actual measurement value of the aluminium spontaneous oxide film does not adversely affect. However, since the aluminium spontaneous oxide film is sandwiched between a pure aluminium film and an LB film, the value of a current flowing through an actual 7-layered MIM switching element may be larger than that of a current flowing through the aluminium spontaneous oxide film due to the following reason.

The absolute value of the tunnel current is the function of the electron density n (vx) in the electrode as described above, and the electrode can be regarded as the pure aluminium film and the polyimide LB film for the aluminium spontaneous oxide film of the 7-layered MIM switching element. For this reason, the electron density in the polyimide LB film is estimated to be lower than the electron density of a current flowing through the pure aluminium film.

When the distributed voltage applied to the polyamide LB film exceeds 0.65 V, the conductive region of the polyimide LB film falls within the F-N conductive region. In the F-N conductive region, a film thickness enough to tunnel electrons is smaller than the actual film thickness of the polyimide LB film. The rest of the electrons is set in a conductive state. A voltage drop in the region set in the conductive state is smaller than voltage drops of the polyimide LB film and the aluminium spontaneous oxide film in the tunnel region. In addition, the capacitance of the polyimide LB film is efficiently increased due to a decrease in thickness of the polyimide LB film in the insulating region, and a voltage drop caused by the capacitor portion of the polyimide LB film is decreased. As a result, it is estimated that the voltage distributed to the aluminium spontaneous oxide film is relatively increased.

Therefore, in FIG. 2, assuming that the value corresponding to V=15 in the actual measurement values (solid line) of the MIM switching element is restricted by a tunnel current obtained when all the voltages (1.5 V) are applied to the aluminium spontaneous oxide film, the actual measurement values (solid line shown in FIG. 3) of the aluminium spontaneous oxide film are plotted by marks Δ in FIG. 2 so as to correspond to the value corresponding to V=15 in the actual measurement values of the MIM switching element.

The plotted marks Δ in FIG. 2 correspond to actual measurement values indicated by the real line within a region of $V \geq 1V$.

The current-voltage characteristics of an MIM switching element constituted by the 7-layered polyimide LB film (the film thickness of 28 Å) used in the first embodiment are restricted by a tunnel current flowing through the polyimide LB film within a range of $V \leq 0.9$ V. Note that the applied voltage is distributed into the aluminium spontaneous oxide film and the polyimide LB film at a capacitance ratio.

Within a range of the applied voltage $V \geq 0.9$ V, the current-voltage characteristics are restricted by a tunnel current flowing through the aluminium spontaneous oxide film. Note that most of the applied voltage is distributed to the aluminium spontaneous oxide film.

In addition, a probability $\Psi^2$ of electrons present on the side opposite to the insulating layer of the element used in the first embodiment can be obtained as follows. When $\Psi^2 = \exp(-2ykyd)$ is calculated, assuming that $k = 4.1 \times 10^9 m^{-1}$ and that $d = 28$ Å (7 molecular layers), the probability $\Psi^2$ is to be $1.1 \times 10^{-10}$.

When this value is decreased, the tunnel current is decreased. The value of the tunnel current becomes gradually close to the value of a leakage current generated by a film defect or an impurity. Since this leakage current generally has ohmic current-voltage characteristics, when the leakage current is increased to influence the current of an MIM switching element, the nonlinearity of the MIM switching element is degraded, or the film durability of the MIM switching element is degraded.

In the current-voltage characteristics shown in FIG. 5, the solid line represents an actual measurement value of an MIM switching element in which a polyimide LB film is constituted by 11 molecular layers (film thickness of 44 Å). The broken line plotted by marks × represents values obtained by calculation.

The MIM switching element at this time has the current-voltage characteristics shown in FIG. 5, since a leakage current is relatively larger than a direct tunnel current because the electron presence probability $\Psi^2$ is given by an equation $\Psi^2 = 2.1 \times 10^{-16}$.

The current-voltage characteristics of various elements in which electron presence probability $\Psi^2$ is changed by changing the thickness of an insulating layer. At this time, when the electron presence probability $\Psi^2$ is less than $1 \times 10^{-15}$, a leakage current influences the current-voltage characteristics. Therefore, a factor for obtaining an MIM switching element in which a tunnel current dominantly flows is the electron presence probability $\Psi^2$ satisfying equation $\Psi^2 = \exp(-2kd) \geq 10^{-15}$.

Figure 6:
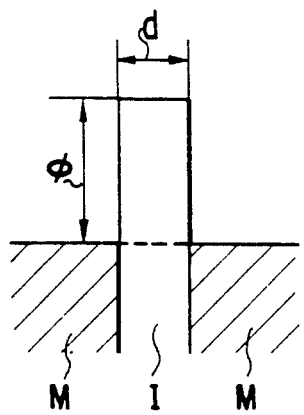
FIG. 6 is a view showing an energy diagram of an MIM switching element with respect to electrons.

That is, when the thickness of a material is decreased to the de Broglie wavelength of electrons in the material, the electrons flow through the material without scattering. This current is a direct tunnel current. Therefore, when the thickness of the insulating layer of the MIM switching element shown in FIG. 6 is decreased to be almost equal to the de Broglie wavelength, a tunnel probability D (Ex) of the electrons flowing through the insulating layer is given by the WEB approximation method with respect to a one-dimensional x direction as the following equation (4):

$$D(EX) = \exp\left[-2 \int_{X2}^{X1} \frac{\{2m(V(x) - Ex)^{\frac{1}{2}}\}}{n} dx\right] \quad (4)$$

where V(x): the height of the potential barrier of the insulating layer, $Ex = mv_x^2/2$: an x component of incident electron energy, $v_x$: a velocity component of electrons in the x direction, $\hbar$: Dirac h $$(\frac{h}{2\pi},$$

h is Planck's constant), m: an electron mass, and $x_1$ and $x_2$: positions of the both ends of the insulating layer. According to the basic concept of equation (4), when the value of V(x) is constant with respect to the value x, a wave function $\Psi(x)$ of electrons in the insulating layer is given by the following equation (5):

$$\Psi(x) = \exp(-kx) \quad (5)$$

$$\text{for } k = \frac{\{2m(V(x) - Ex)\}^{\frac{1}{2}}}{h} \quad (6)$$

That is, "k" is a damping factor of the wave function of the electrons in the insulating layer. This damping factor is a function of the height $\phi = V(x) - Ex$ of the barrier of the insulating layer with respect to the Fermi level of a metal layer, and the height $\phi$ of the barrier of the insulating layer is increased.

Therefore, when the above MIM switching element is used as an active element, in order to obtain a practical current density, electron presence probability $\Psi^2$ on the side opposite to the insulating layer to which a voltage is not applied is desirably set to be $\Psi^2 = \exp(-2kd) \geq 10^{-15}$.

In the MIM switching element having the above arrangement, since the current flowing through the MIM switching element is dominated by a direct tunnel current, even when a current flows into the MIM switching element during write/read access of memory data, the MIM switching element does not generate heat, and the nonlinear switching characteristics are not degraded. In addition, even when a voltage required for writing data in a memory element is less than 1 V, the MIM switching element can be driven, and peripheral circuits are simplified, thereby decreasing power consumption. Therefore, the integration density of memory elements and the cost thereof can be easily decreased.

When the MIM switching element according to the first embodiment of the present invention is used in a memory element, since a switching current is a direct tunnel current, heat generation caused by write/read access of memory data is suppressed, and nonlinear switching characteristics are not degraded. In addition, even when a voltage required for write data in the memory element is less than 1 V, the switching element can be driven. Since the MIM switching element is a two-terminal switch, if it is used in a memory element, the MIM switching element does not require a peripheral circuit for a driving operation unlike a transistor switch, thereby decreasing power consumption.

Figure 7:
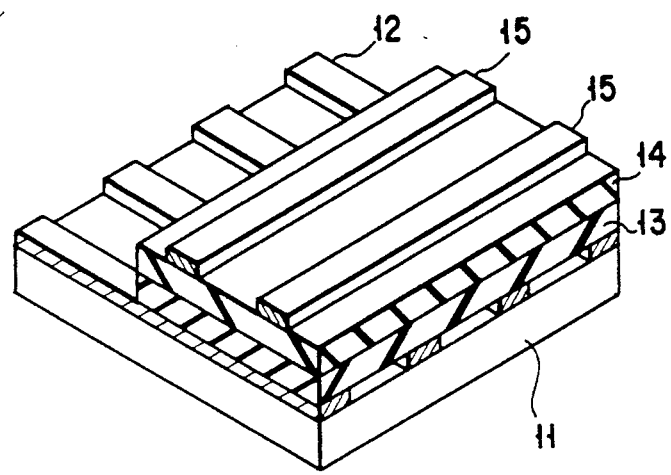
FIG. 7 is a perspective view showing a part of an arrangement of a memory cell array according to the second embodiment of the present invention obtained by arranging memory cells having the MIM switching element of the first embodiment in a matrix form.
Figure 8:
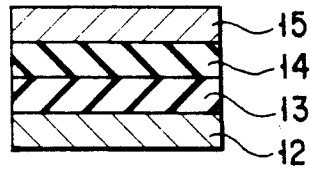
FIG. 8 is a sectional view showing one MIM memory cell of the memory cell array in FIG. 7.

FIG. 7 is a perspective view showing a part of an arrangement of a memory cell array ($n \times n$, the number of cells is $n^2$) in which memory cells (memory elements) using the MIM switch of the first embodiment are arranged in a matrix form as the second embodiment, and FIG. 8 shows one of the memory cells in the memory cell array.

In this structure, several first metal electrodes (lower electrodes) 12 are formed on a semiconductor substrate 11 in a stripe form, and a ferroelectric layer 13 serving as a data recording section and an insulating (LB) film 14 made of polyimide and serving as a switching element are formed on the first metal electrodes 12. Several second metal electrodes (upper electrodes) 15 are formed on the insulating film 14 in a stripe form to be perpendicular to the longitudinal direction of the metal electrode 12.

One memory cell in the memory cell array has, as shown in FIG. 8, a multi-layered structure constituted by the lower electrode 12, the insulating (LB) film 13, the ferroelectric layer 14, and the upper electrodes 15.

Figure 9:
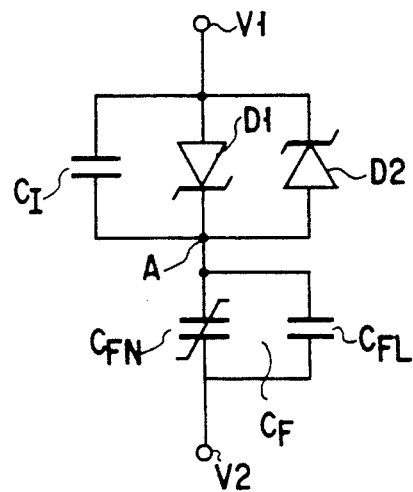
FIG. 9 is a circuit diagram showing an equivalent circuit of the memory cell according to the second embodiment.

The equivalent circuit of the memory cell is shown in FIG. 9.

In the arrangement of the equivalent circuit, both the terminals of a capacitor $C_I$ are connected to constant voltage diodes $D_1$ and $D_2$ which are parallelly connected to each other as the switching section to allow a current to flow in both the directions. One end of each of a ferroelectric nonlinear capacitor CFN and a ferroelectric linear capacitor $C_{FL}$ which are parallelly connected to each other and used as the data recording section is connected to one end of a corresponding one of the constant voltage diodes $D_1$ and $D_2$. A terminal $V_1$ (upper electrode) is connected to the other terminal of each of the constant voltage diodes $D_1$ and $D_2$, and a terminal $V_2$ (lower electrode) is connected to the other terminal of each of the ferroelectric nonlinear and linear capacitors $C_{FN}$ and $C_{FL}$. In this case, it is assumed that a capacitance ratio of the capacitor $C_I$ to the linear capacitor $C_{FL}$ is given as $C_I:C_F = 1:9$.

A method of reading polarization (data) from the above-arranged memory cell by applying a voltage pulse to the terminals $V_1$ and $V_2$ will be described below.

Figure 10:
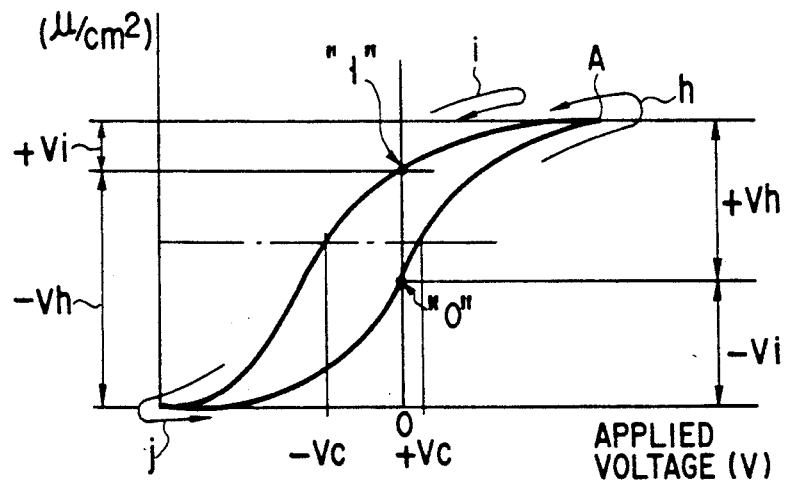
FIG. 10 is a graph showing hysteresis characteristics of a ferroelectric body.

Charges stored in a composite capacitor $C_F$ consisting of the ferroelectric nonlinear and linear capacitors $C_{FN}$ and $C_{FL}$ are set in the state of a "0" position of the hysteresis characteristics curve shown in FIG. 10.

Figure 11:
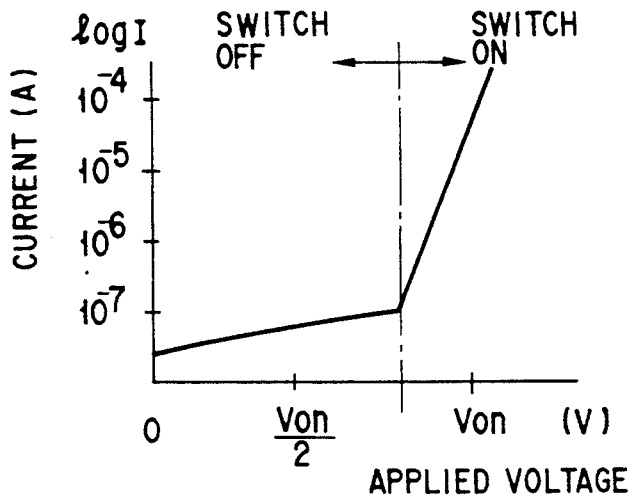
FIG. 11 is a graph showing current-voltage characteristics (I-V characteristics) of an MIM structure.

When the memory cell is set in an OFF state, a voltage of an applied voltage $V_{ON}$ (in FIG. 11) or more is applied to the terminal $V_1$ of the memory cell. Note that the terminal $V_2$ is grounded.

Immediately after the applied voltage YON is applied, the voltage is separately applied and distributed by a capacitance distribution of the capacitors $C_I$ and $C_{FL}$. That is, a voltage of 9/10 $V_{ON}$ (V) is applied between the terminal $V_1$ and a connection point A, and a voltage of 1/10 $V_{ON}$(V) is applied between the connection point A and the terminal $V_2$.

At this time, since the insulating film has the above linear I-V characteristics, an ON state is set between the terminal $V_1$ and a connection point c by applying the voltage of 9/10 $V_{ON}$ (V), and the potential therebetween is changed to about 0 (V).

Therefore, the potential between the connection point A and the terminal $V_2$ becomes about $V_{ON}$ (V). Assuming that the voltage of $V_{ON}$ (V) is higher than a coercive voltage vc shown in FIG. 10, the composite capacitor $C_F$ allows an inverted current indicated by the curve of a + inverted current a of FIG. 12 to flow.

When the composite capacitor $C_F$ is set at a "1" position shown in FIG. 10, the same change in voltage as that of a case wherein the composite capacitor $C_F$ is set at the "0" position is performed. However, the composite capacitor $C_F$ allows a non-inverted current indicated by the curve of a + non-inverted current b of FIG. 12 to flow.

That is, an inverted current and a non-inverted current can flow into a ferroelectric body by controlling a voltage between the terminals $V_1$ and $V_2$ shown in FIG. 9. Although the structure used in this case is similar to a conventional MIM+C (capacitor) structure, charges stored in a dielectric body (including a ferroelectric body) is not stored in a data storage medium, but a polarization state of a ferroelectric body is stored therein. For this reason, when charges leak through a resistor of an insulating film to be smaller than a detectable value, an influence of data destruction can be neglected unless the polarization state is inverted. Since a polarization state is not generally changed unless an opposite voltage ($-Vc$) is applied, stored data is stably restrained.

In a conventional memory cell array having the arrangement in which memory cells are capacitively coupled to each other, even when one memory cell is selected from the memory cells arranged in a matrix form of n columns $\times$ n rows, a voltage of about $\frac{1}{2}$ $V_{ON}$ (V) is applied to other 2(n−1) memory cells as a voltage (factor) for causing crosstalk. For this reason, crosstalk, e.g., destruction of data of a non-selected memory cell, may occur. A countermeasure circuit (peripheral circuit) is added by various methods to prevent the crosstalk. However, even when any one of the methods is employed, a ratio of the area of a peripheral circuit to the area of the memory device is larger than a ratio of the area of a memory cell for recording data to the area of the memory device.

Similarly, a specific one of the memory cells capacitively coupled to each other in the matrix memory cell array of the present invention is selected, and a write/read voltage is applied across the terminals $V_1$ and $V_2$. In this case, a voltage of 9/20 $V_{ON}$ (V) is applied between the terminal $V_1$ and the connection point A, and a voltage of 1/20 $V_{ON}$ (V) is applied between the connection point A and the terminal $V_2$. At this time, when the memory cell ($V_{ON}/2$ (V)) is set in an OFF state, the LB film is not turned on, and the potentials between the $V_1-A$ and between the $A-V_2$ are not changed. At this time, when the voltage of 1/20 $V_{ON}$ (V) is sufficiently smaller than the coercive voltage Vc, a polarization is not inverted, and the crosstalk of stored data does not occur.

FIG. 13 is a schematic view showing a memory circuit in which the above memory cell array is used.

The arrangement of this circuit is roughly divided into a memory section 21 consisting of a memory cell array in which memory cells M ($M_1$ ..., Mn) each having the above MIM switching element are arranged in an n×n matrix form, a sense amplifier section 22, and a rewrite signal generating section 23. For the sake of descriptive simplicity, only the minimum components are used.

In the memory section 21, X and Y lines 24 and 25 of X and Y addresses are alternatively connected to each memory cell. MOS switches X ($X_1, X_2, \ldots, X_n$) and MOS switches y ($Y_1, Y_2, \ldots, Y_n$) which are constituted by MOS transistors for selecting a desired memory cell are arranged on the input/output sides of the X and Y lines 24 and 25, respectively. An input terminal 26 is arranged in the X line 24, and diodes D ($D_1, \ldots, D_n$) each having a grounded anode are connected to the output terminals of the MOS switches Y, respectively.

The sense amplifier section 22 is constituted by a transistor Q1 and a differential amplifier. The transistor Q1 is driven in response to an amplifier clear signal which is input from an amplifier clear signal input terminal 27 and erases previous data (stored data) to initialize the state of the amplifier, thereby erasing data. The transistor Q1 forms lines used during write access of data. The differential amplifier having a comparison charge input terminal 28 is driven by applying a comparison charge, i.e., an intermediate charge as an integration value larger than a non-inverted charge and smaller than an inverted charge, from a dummy cell.

Data output from the sense amplifier section 22 is sent to a next-stage circuit (not shown) and to the rewrite signal generating section 23 for performing a rewriting operation to a memory cell data distracted by read access. This rewrite signal generating section 23 is used for rewriting stored data in the memory cell date-destructed by read access.

That is, the data output from the sense amplifier section 22 is input to the rewrite signal generating section 23, a switching circuit consisting of transistors is controlled to generate a rewrite signal by a pulse signal input from a rewrite timing pulse input terminal 29 and representing a timing of the data-destructed memory cell.

The generated rewrite signal is fed back to the input terminal 26 of the memory cell array, and data is rewritten in a selected data-destructed memory cell.

Timing charts during read access of data for the memory circuit having the above arrangement are shown in FIGS. 14A and 14B, and a detailed operation of the memory circuit will be described below. In this case, a measurement point of each item of the timing charts is illustrated as a reference numeral in FIG. 13.

A case wherein "0" is stored as data will be described below with respect to read access of data shown in FIG. 14A.

When read access is performed to the memory cell array, one line is selected from each of the X and Y lines 24 and 25 of the X and Y addresses (time t1), and for example, the MOS switches $X_1$ and $Y_1$ are turned on to select a cell $M_1$. According to this selection, a WE (write enable) signal is input to a transistor Q2 (measurement point c) in the sense amplifier 22 to cause the sense amplifier 22 to be set in an operative state.

Thereafter, a read pulse is applied to the input terminal 26 (time t2). The data stored in the cell $M_1$ is read as an inverted charge by the read pulse and input to the sense amplifier 22. The read pulse input from the input terminal 26 is turned off.

The read pulse and the like input from the input terminal 26 are disabled, and a measurement point a is returned from "1" to "0". In addition, after a predetermined period t3 from when the data is output to when the data is defined, the rewrite signal (measurement point e) is generated (time t4), and data is returned from "1" to "0" by applying a pulse having a bias opposite to that of the input pulse to the input terminal 26, thereby completing a rewriting operation for the cell $M_1$.

Upon a lapse of a predetermined period after a rewriting operation starts (time t5), the rewriting operation is stopped. That is, the rewrite signal (measurement point e), the WE signal (measurement point c), the MOS switch $X_1$ of the X address, and the MOS switch $Y_1$ of the Y address are turned off. In accordance with this, the rewrite signal is returned to "0". At this time, the amplifier clear signal (measurement point b) goes from "0" to "1" to erase data remaining in the sense amplifier 22.

The above flow chart is ended, and the flow is returned to an initial state and set in a waiting state for the next input.

A case wherein "1" is stored as data will be described below with respect to read access of data shown in FIG. 14B.

In this case, read access to the memory cell array is performed to be described below. As in the case of the data "0", one line is selected from each of the X and Y lines 24 and 25 of the X and Y addresses, and for example, the MOS switches $X_1$ and $Y_1$ are turned on to select the cell $M_1$ (time t6). According to this selection, the WE signal is input to the transistor Q2 (measurement point c) of the sense amplifier 22 to cause the sense amplifier 22 to be set in an operative state.

Thereafter, when a read pulse or a rewrite signal is input to the input terminal 26 (time t7), the measurement point a is shifted from "0" to "1", and data is read from the cell $M_1$ storing the data.

After a predetermined period (between t7 and t8) from when the read pulse and the like are input to when a data output signal "0" is defined, when "1" is stored as data although a rewrite signal (measurement point e) is generated, the data is not distracted, and a rewriting operation is not required. For this reason, the rewrite signal is not applied as indicated by the measurement point a in FIG. 14B. Thereafter, the rewrite signal (measurement point e), the WE signal (measurement point b), the MOS switch $X_1$ of the X address and the MOS switch $Y_1$ of the Y address are turned off. At this time, the amplifier clear signal (measurement point b) operates the sense amplifier 22 to erase data remaining in the sense amplifier 22.

After the data is erased, when the amplifier signal (measurement point b) goes from "1" to "0", the cell $M_1$ is selected for the next new cycle (time t10).

Timing charts during write access of data for the above memory circuit are shown in FIGS. 15A and 15B, and a detailed operation of the memory circuit will be described below. In this case, a measurement point of each item of the timing charts is illustrated as a reference numeral in FIG. 13.

A case wherein "1" is stored as data will be described below with respect to read access of data shown in FIG. 15A.

When write access is performed to the memory cell array, one line is selected from each of the X and Y lines 24 and 25 of the X and Y addresses (time t11), and for example, the MOS switches $X_1$ and $Y_1$ are turned on to select a cell $M_1$. According to this selection, an amplifier clear signal (measurement point b) is input from the amplifier clear signal input terminal 27 to erase previous data remaining in the sense amplifier 22. At the same time, a write line is formed.

Thereafter, a positive pulse applying voltage of data to be stored is applied from the input terminal 26 for a predetermined period t13 to write the data "1" in the cell $M_1$. The positive pulse applying voltage is higher than a coercive voltage (+Vc). In addition, the MOS switches $X_1$ and $Y_1$ are turned off, and an amplifier clearing operation is completed (time t14).

Thus, the data "1" can be written in a desired cell of the memory cell array.

A case wherein "1" is stored as data will be described below with respect to write access of data shown in FIG. 15B.

In this case, read access to the memory cell array is performed to be described below. As in the case of the data "1", one line is selected from each of the X and Y lines 24 and 25 of the X and Y addresses (time t15), and for example, the MOS switches $X_1$ and $Y_1$ are turned on to select the cell $M_1$.

After the cell $M_1$ is selected, a negative pulse having a voltage higher than a voltage (−Vc) opposite to the above coercive voltage (+Vc) is applied to cause an opposite current from the diode $D_1$ to flow to the cell $M_1$, thereby writing data "0". In addition, the switches $X_1$ and $Y_1$ are turned off, and an initializing operation of the sense amplifier 22 is completed (time t16).

Therefore, in the read/write access of data to the above memory circuit, when the rewrite pulse generating section 23 reads out an inverted charge Vh, the rewrite pulse generating section 23 automatically applies a rewrite pulse to a memory cell in response to a rewrite timing pulse so as to perform a rewriting operation of the data. when a non-inverted charge Vi is read out, since no rewrite pulse is applied to a memory cell, degradation of the element is reduced.

Figure 12:
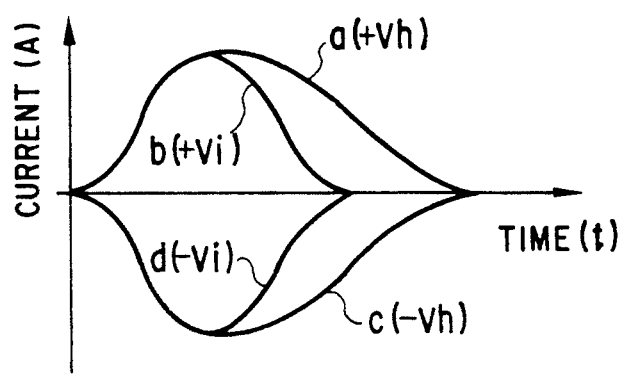
FIG. 12 is a graph showing characteristics of q inverted currents and q non-inverted currents.
Figure 16:
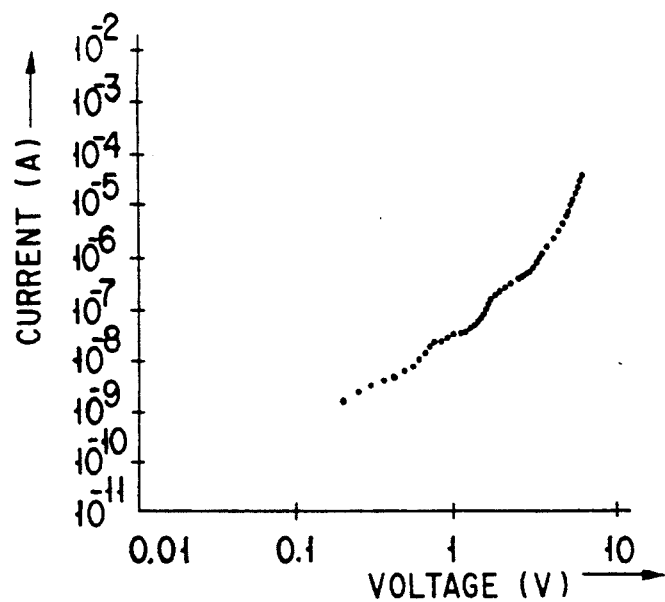
FIG. 16 is a graph showing current-voltage characteristics of an MIM element in which an insulating layer is constituted by 30 polyimide insulating layers.
Figure 17:
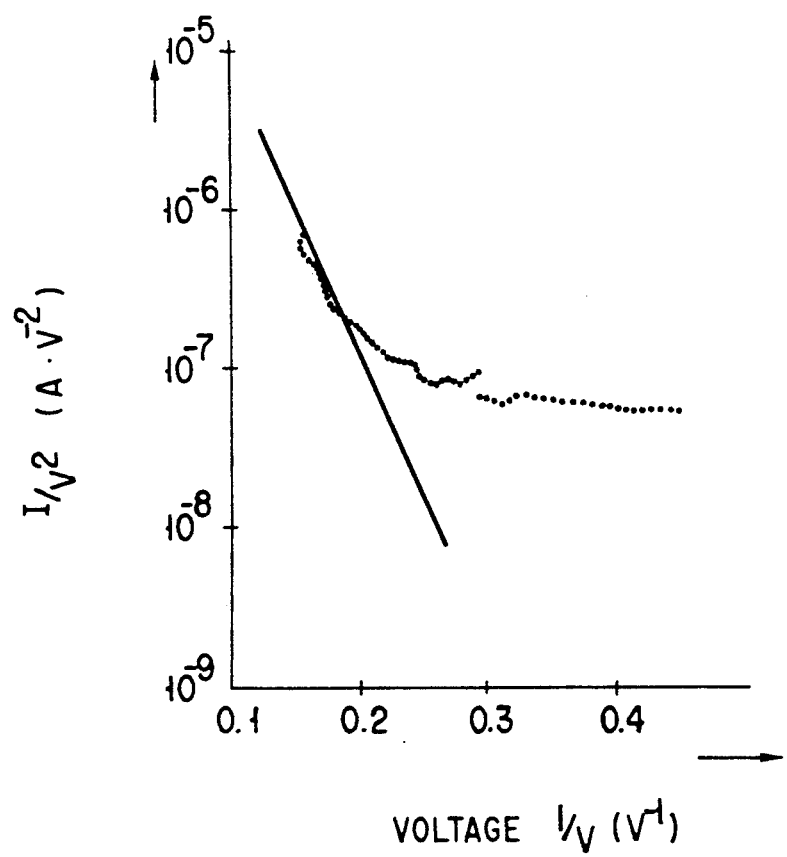
FIG. 17 is a graph showing a voltage-current (1/V-I/V²) of the nonlinear conductivity element.

In addition, although the non-inverted charge Vi and the inverted charge Vh are used as data of the above embodiment, the embodiment may be the following arrangement. When a charge shown in the hysteresis characteristic curve of FIG. 10 is set on the negative side with respect to data "0", i.e., when a charge is a non-inverted current (−Vi) and a − inverted charge (−Vh) and when a − inverted current c and a − non-inverted current d shown in FIG. 12 are used, data is stored in the memory cell array in the same operation as described above.

Therefore, when data "0" stored in the memory cell is read out (arrow h) as described above such that the date of the memory cell is updated to data "1", an applied voltage (−Vh) indicated by an arrow j is applied, and a rewriting operation is performed such that the data "1" is updated with the previous stored data "0".

A switching operation for write access of polarization data in a ferroelectric body can be performed by one bipolar switch (MIM structure). A peripheral circuit for driving a switching element is not required. The peripheral circuit is required when an element such as a transistor is conventionally used as a switch. The circuit is simplified, and the integration density of the circuit can be increased. Leakage from an insulating film retaining charges is small. In addition, since data is recorded as polarization of a ferroelectric body, a data retention time is not almost influenced.

When a Langmuir-Blodgett film used for forming the MIM switching element of the present invention is formed, since the film is formed on the basis of electron presence probability $\Psi^2$ to have the thickness of an insulating film in which a direct tunnel current dominantly flows, the MIM switching element of the present invention is free from conventional problems such as an influence of an aluminium spontaneous oxide film formed at the interface between an aluminium electrode and a polyimide LB film, heat generation, and degradation of nonlinear switching characteristics.

As described above, according to a memory element having the MIM switching element of the present invention, memory cells can be integrated at a high density due to a simple memory cell structure. In addition, since a switch is arranged to each memory cell, crosstalk does not occur.

The present invention is not limited to the above embodiment. For example, although the above memory cell array is obtained by two-dimensionally arranging memory cells having an MIM structure, a three-dimensional array structure obtained by stacking the memory cell arrays into a plurality of stages may be used.

Additional adVantages and modifications will readily occur to those skilled in the art. Therefore, the invention in its broader aspects is not limited to the specific details, representative devices, shown and described herein. Accordingly, various modifications may be made without departing from the spirit or scope of the general inventive concept as defined by the appended claims and their equivalents.

What is claimed is:

1. A memory cell array device wherein memory cells having a multi-layered structure in which a first conductivity layer is formed on one major surface of an insulating layer of a Langmuir-Blodgett film and a second conductive layer is formed on the other major surface to sandwich a ferroelectric layer for variably changing a polarization state by inputting a charge are arranged in a matrix form, and write/read access of data is performed by a change in polarization of said ferroelectric layer of said memory cell using tunnel switch property of said insulating layer, comprising:

selecting means for selecting a desired memory cell in said memory cell array;

reading means for reading data stored in said memory cell selected by said selecting means and for sending the data as inverted/non-inverted charges;

data erasing means for erasing previous data read and retained by said reading means before new data is read and for setting said reading means in an initial state; and rewriting means for detecting destructive read access of data stored in a desired memory cell in response to a reading operation of said reading means and for rewriting data ready by said reading means at a predetermined timing on the basis of a detection signal.

2. A device according to claim 1, wherein, even when charges stored as data leak through a resistor of said insulating film such that a value of the remaining charges is lower than a detectable value, data can be extracted from the polarization state of said ferroelectric layer unless the polarization state is inverted.

3. A device according to claim 1, wherein said selecting means for selecting a desired memory cell in said memory cell array is constituted by X and Y lines alternatively connected to memory cells of said memory cell array and MOS switches X and Y connected to input-/output sides of said X and Y lines and constituted by MOS transistors for specifying the desired memory cell.

4. A device according to claim 1, wherein said data erasing means comprises:
an initializing signal input terminal for receiving an amplifier clear signal for initializing an amplifier; and
a transistor, driven by the amplifier clear signal from said initializing signal input terminal, for erasing data remaining in said amplifier and forming a line used in write access of data.

5. A device according to claim 1, wherein said reading means comprises a differential amplifier driven by applying a comparison charge, i.e., an intermediate charge larger than a non-inverted charge and smaller than an inverted charge as an integration value with respect to an output value output from a dummy cell arranged in said memory cell array.

6. A device according to claim 1, wherein said rewriting means includes a switching circuit constituted by a transistor for receiving data output from said reading means, generating a rewrite signal in response to an external rewrite timing pulse signal representing a write timing of a data-destructed memory cell, feeding back the rewrite signal to an input terminal of said memory cell array, and rewrite data in a selected and data-destructed memory cell.

* * * * *